(12) United States Patent
Sandhu et al.

(10) Patent No.: US 8,759,807 B2
(45) Date of Patent: Jun. 24, 2014

(54) MEMORY CELLS

(75) Inventors: Gurtej S. Sandhu, Boise, ID (US);
Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/427,529

(22) Filed: Mar. 22, 2012

(65) Prior Publication Data

US 2013/0248797 A1 Sep. 26, 2013

(51) Int. Cl.
*H01L 29/00* (2006.01)
*H01L 47/00* (2006.01)
*H01L 29/02* (2006.01)
*H01L 29/04* (2006.01)
*H01L 29/06* (2006.01)
*H01L 47/02* (2006.01)

(52) U.S. Cl.
USPC ............... 257/2; 257/1; 257/3; 257/4; 257/5; 257/6

(58) Field of Classification Search
CPC .......... H01L 29/02; H01L 47/00; H01L 47/02
USPC ................................ 257/2, 3, 4; 365/148, 163
See application file for complete search history.

(56) References Cited

U.S. PATENT DOCUMENTS

| 5,128,744 | A | 7/1992 | Asano et al. |
| 7,799,672 | B2 | 9/2010 | Hashimoto et al. |
| 2008/0017894 | A1* | 1/2008 | Happ et al. ............... 257/246 |
| 2009/0250681 | A1* | 10/2009 | Smythe et al. ............ 257/4 |
| 2010/0102306 | A1* | 4/2010 | Hsu et al. ................ 257/42 |
| 2010/0265762 | A1* | 10/2010 | Cheung et al. ........... 365/163 |
| 2011/0031546 | A1 | 2/2011 | Uenaka et al. |
| 2011/0108907 | A1 | 5/2011 | Maeda |
| 2011/0220987 | A1 | 9/2011 | Tanaka et al. |

OTHER PUBLICATIONS

U.S. Appl. No. 12/886,283, filed Sep. 20, 2010 by Smythe et al.
U.S. Appl. No. 13/084,011, filed Apr. 11, 2011 by Liu et al.
U.S. Appl. No. 13/275,168, filed Oct. 17, 2011 by Sills et al.
U.S. Appl. No. 13/298,840, filed Nov. 17, 2011 by Tang et al.
U.S. Appl. No. 13/340,375, filed Dec. 29, 2011 by Ramaswamy et al.

* cited by examiner

*Primary Examiner* — Steven Loke
*Assistant Examiner* — Juanita B Rhodes
(74) *Attorney, Agent, or Firm* — Wells St. John P.S.

(57) ABSTRACT

Some embodiments include methods of forming memory cells. An opening is formed over a first conductive structure to expose an upper surface of the first conductive structure. The opening has a bottom level with a bottom width. The opening has a second level over the bottom level, with the second level having a second width which is greater than the bottom width. The bottom level of the opening is filled with a first portion of a multi-portion programmable material, and the second level is lined with the first portion. The lined second level is filled with a second portion of the multi-portion programmable material. A second conductive structure is formed over the second portion. Some embodiments include memory cells.

6 Claims, 11 Drawing Sheets

MEMORY CELLS

TECHNICAL FIELD

Memory cells and methods of forming memory cells.

BACKGROUND

Memory is one type of integrated circuitry, and is used in systems for storing data. Memory is usually fabricated in one or more arrays of individual memory cells. The memory cells are configured to retain or store information in at least two different selectable states. In a binary system, the states are considered as either a "0" or a "1". In other systems, at least some individual memory cells may be configured to store more than two levels or states of information.

Integrated circuit fabrication continues to strive to produce smaller and denser integrated circuits. Accordingly, there has been substantial interest in memory cells that can be utilized in structures having programmable material between a pair of electrodes. Examples of such memory cells are resistive RAM (RRAM) cells, phase change RAM (PCRAM) cells, and programmable metallization cells (PMCs)—which may be alternatively referred to as a conductive bridging RAM (CBRAM) cells, nanobridge memory cells, or electrolyte memory cells. The memory cell types are not mutually exclusive. For example, RRAM may be considered to encompass PCRAM and PMCs.

The programmable materials have two or more selectable resistive states to enable storing of information. Programmable materials that are receiving increasing interest are multi-portion materials (which are sometimes referred to in the art as multi-layer materials). Example multi-portion programmable materials are materials containing at least two different oxide portions. Such materials may be programmed by moving oxygen species (for instance, oxygen ions) within and between the different portions. Other example multi-portion programmable materials are materials comprising an ion source region and a switching region. The ion source region may comprise, for example, a combination of copper and tellurium; and the switching region may comprise, for example, an oxide or solid state electrolyte.

The utilization of multi-portion programmable materials can provide advantages in nonvolatile memory applications. For instance, the multi-portion programmable materials may enable specific memory states to be tailored for particular applications. Although multi-portion programmable materials show promise for utilization in nonvolatile memory architectures, there remain challenges in incorporating such materials into integrated circuitry.

DETAILED DESCRIPTION OF THE ILLUSTRATED EMBODIMENTS

Some embodiments include methods in which one portion of a multi-portion programmable material is contained within a container defined by another portion of the programmable material, and then chemical-mechanical polishing (CMP) or other suitable planarization is utilized to form a planarized surface. Some embodiments include memory cells comprising multi-portion programmable material.

Example embodiments are described with reference to FIGS. 1-10.

Figure 1:
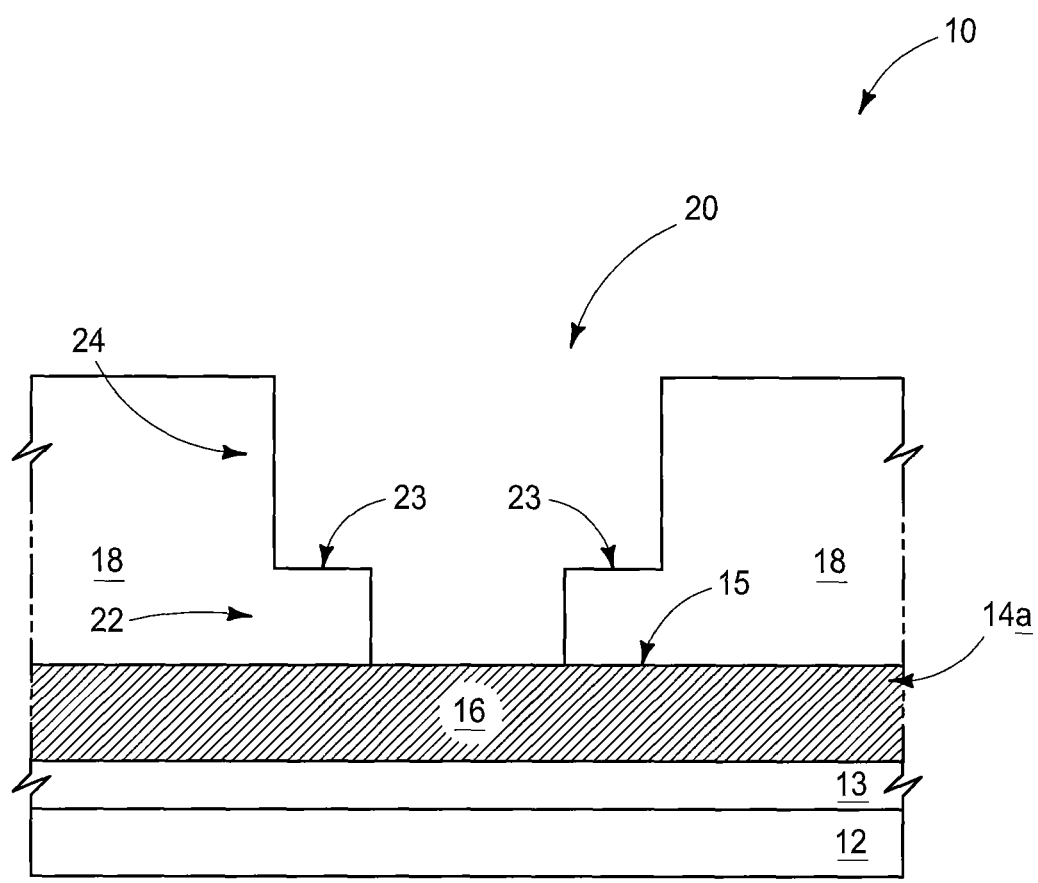
FIGS. 1 and 3-6 are diagrammatic cross-sectional views of a portion of a semiconductor construction at various process stages of an example embodiment method of forming memory cells.

Referring to FIG. 1, a semiconductor construction 10 comprises a base 12. Base 12 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous materials in some embodiments. For instance, base 12 may correspond to a semiconductor substrate containing one or more materials associated with integrated circuit fabrication. In such embodiments, such materials may correspond to one or more of refractory metal materials, barrier materials, diffusion materials, insulator materials, etc.

An electrically insulative material 13 is over base 12, and an electrically conductive structure 14a is over the electrically insulative material.

The electrically insulative material 13 may comprise any suitable composition or combination of compositions; and in some embodiments may comprise, consist essentially of, or consist of one or more of silicon dioxide, silicon nitride, and any of various doped silicate glasses (for instance, borophosphosilicate glass, phosphosilicate glass, fluorosilicate glass, etc.).

The conductive structure 14a comprises electrically conductive material 16. The electrically conductive material may comprise any suitable composition or combination of compositions; and in some embodiments may comprise, consist essentially of, or consist of one or more of various metals (for instance, copper, tungsten, titanium, platinum, palladium, etc.), metal-containing compounds (for instance, metal carbide, metal silicides, metal nitrides, etc.) and conductively-doped semiconductor materials (for instance, conductively-doped germanium, conductively-doped silicon, etc.).

An electrically insulative material 18 is over conductive structure 14a and insulative material 13. The material 18 may comprise any suitable composition or combination of compositions; and in some embodiments may comprise, consist essentially of, or consist of one or more of silicon dioxide, silicon nitride and any of various doped silicate glasses. The material 18 may be a same composition as material 13 in some embodiments, and in other embodiments may be a different composition from material 13. In some embodiments, material 18 may comprise a stack of two or more different compositions; such as, for example, silicon dioxide directly against silicon nitride.

An opening 20 extends through material 18 to an upper surface 15 of the structure 14a. The opening 20 has two levels 22 and 24, with level 24 being wider along the cross-section section of FIG. 1 then level 22. The levels join to one another at a step 23 in the shown embodiment. Although the step is shown to be substantially horizontal, in other embodiments the step may be angled; and in some embodiments may be curved. The level 22 may be referred to as a bottom level of opening 20, and the level 24 may be referred to as a second level which is over the bottom level. The width of level 22 may be referred to as a bottom width of the opening 20, and the width of the level 24 may be referred to as a second width of the opening.

Figure 1A:
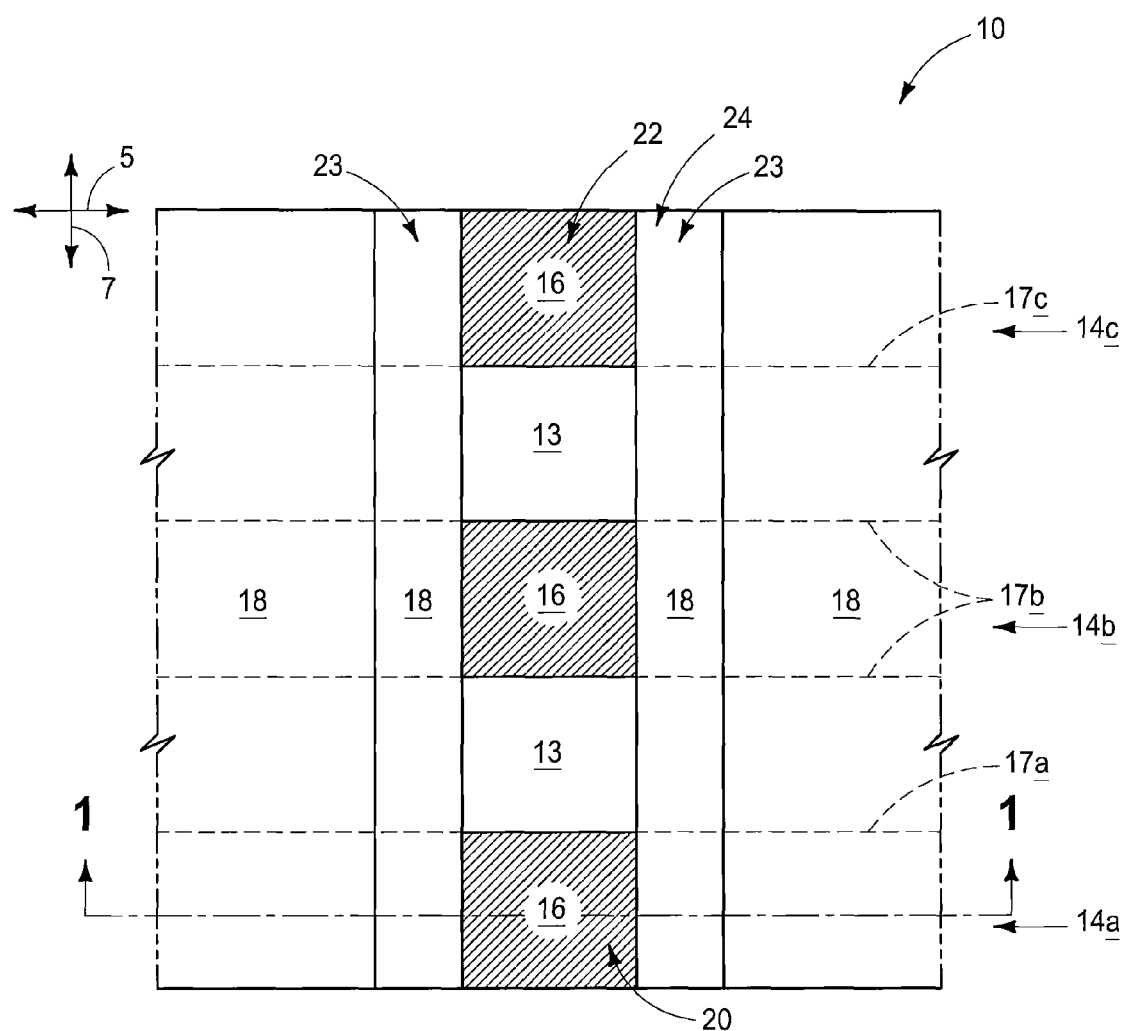
FIGS. 1A, 5A and 6A are top views of the constructions of FIGS. 1, 5 and 6, respectively. The view of FIG. 1 is along the line 1-1 of FIG. 1A, the view of FIG. 5 is along the line 5-5 of FIG. 5A, and view of FIG. 6 is along the line 6-6 of FIG. 6A.

Referring to FIG. 1A, an example embodiment is illustrated in which the structure 14a is shown to be one of a plurality of lines 14a-14c which extend along a direction of an illustrated axis 5 (edges of lines 14a-14c that are under material 18 are indicated with the dashed-lines 17a-17c in FIG. 1A). The regions of the lines 14a-14b directly under trench 20 will ultimately be incorporated into memory cells, with an example memory cell being shown and described with reference to FIG. 6. In some embodiments, the regions of the lines associated with memory cells have one or more additional conductive materials (not shown) over the conductive material 16 relative to the remainders of the lines, with such additional conductive materials being suitable to improve adhesion of programmable material (discussed below with reference to FIG. 3) to the lines, and/or to improve electrical coupling between the lines and the programmable material. Accordingly, although the lines 14a-14c are illustrated to have continuous upper surfaces of exposed material 16, in some embodiments (not shown) the exposed upper surfaces may have different conductive materials in regions where memory cells will ultimately be formed relative to other regions that will extend between the memory cells.

The levels 22 and 24 of opening 20 are shown to correspond to a pair of trenches in the top view of FIG. 1A. Such trenches may be formed with any suitable processing; including, for example utilization of one or more masks (not shown) to define locations of the trenches, and utilization of one or more etches to form the trenches in the defined location. The masks may be a patterned photoresist masks, or may be any other suitable masks.

FIG. 1A shows the axis 5 crossing an axis 7 which is substantially orthogonal to the axis 5. The cross-section of FIG. 1 extends along the axis 5. In some embodiments, the cross-section of FIG. 1 may be considered to extend along a first direction (i.e., the direction of axis 5), and the axis 7 may be considered to extend along a second direction which intersects the first direction; and which is substantially orthogonal to the first direction in the shown embodiment. The term "substantially orthogonal" is utilized to indicate that the described features are orthogonal to within reasonable tolerances of fabrication and measurement. The trenches 22 and 24 extend along the axis 7 in the shown embodiment.

Figure 1B:
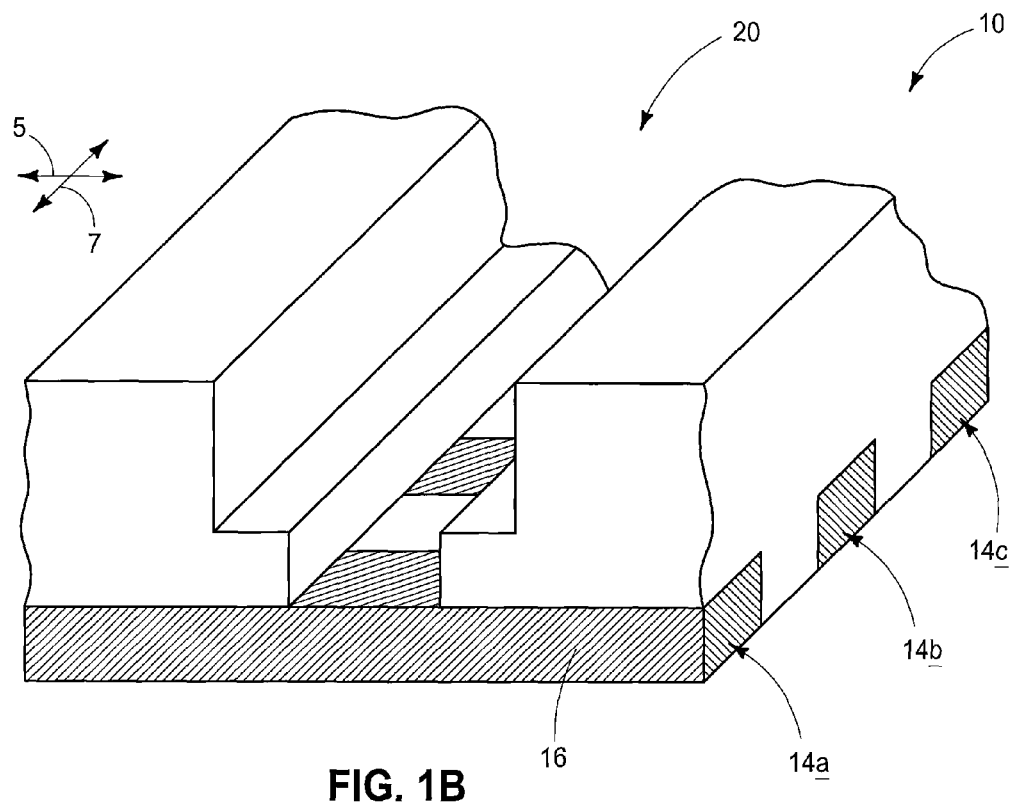
FIG. 1B is a three-dimensional view of a portion of the embodiment of FIG. 1.

FIG. 1B shows a three-dimensional view of construction 10 to assist the reader in understanding the illustrated example embodiment relationship of the trench to the underlying conductive structures 14a-14c. Although the conductive structures are shown as straight lines extending along axis 5, in other embodiments the conductive structures may be curved lines or wavy lines extending primarily along such axis. Similarly, the trenches 22 and 24 may extend straight along axis 7, or may be curved or wavy configurations extending primarily along axis 7 in other embodiments.

Figure 2:
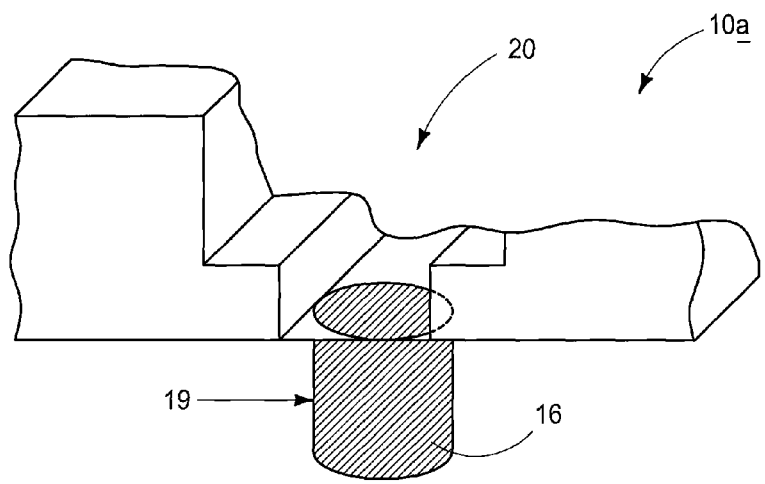
FIG. 2 is a three-dimensional view of an alternative embodiment to that of FIG. 1.

The conductive structures 14a-14c are example conductive structures, and other configurations of conductive structures may be utilized in other embodiments. For instance, FIG. 2 shows a construction 10a illustrating an example embodiment in which the conductive material 16 is fabricated as a conductive plug 19.

Figure 3:
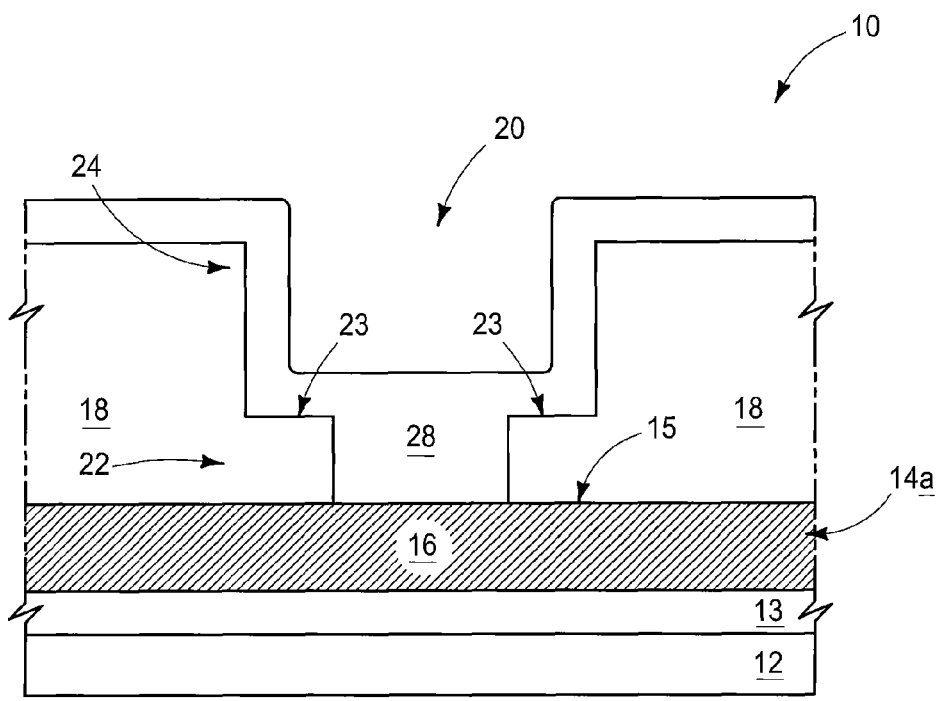

FIG. 3 shows construction 10 at a processing stage subsequent to that of FIG. 1. A first portion 28 of a multi-portion programmable material is formed within opening 20. The first portion fills the bottom level 22 of the opening and lines sidewalls of the second level 24 of the opening. In some embodiments, the levels 22 and 24 may correspond to first and second trenches, respectively, extending in and out of the page relative to the cross-sectional view of FIG. 3 (as illustrated above in FIGS. 1A and 1B). In such embodiments, the first portion 28 fills the first trench and lines sidewalls of the second trench.

In some embodiments, isotropic etching and/or anisotropic etching may be conducted after formation of portion 28 to remove portion 28 from over an upper surface of material 18 while leaving the portion within bottom level 22 of opening 20, and along sidewalls of level 24. For instance, the portion 28 may be etched to form a "sidewall spacer" type structure directly over step 23. In the shown embodiment, such etching has not been conducted.

Figure 4:
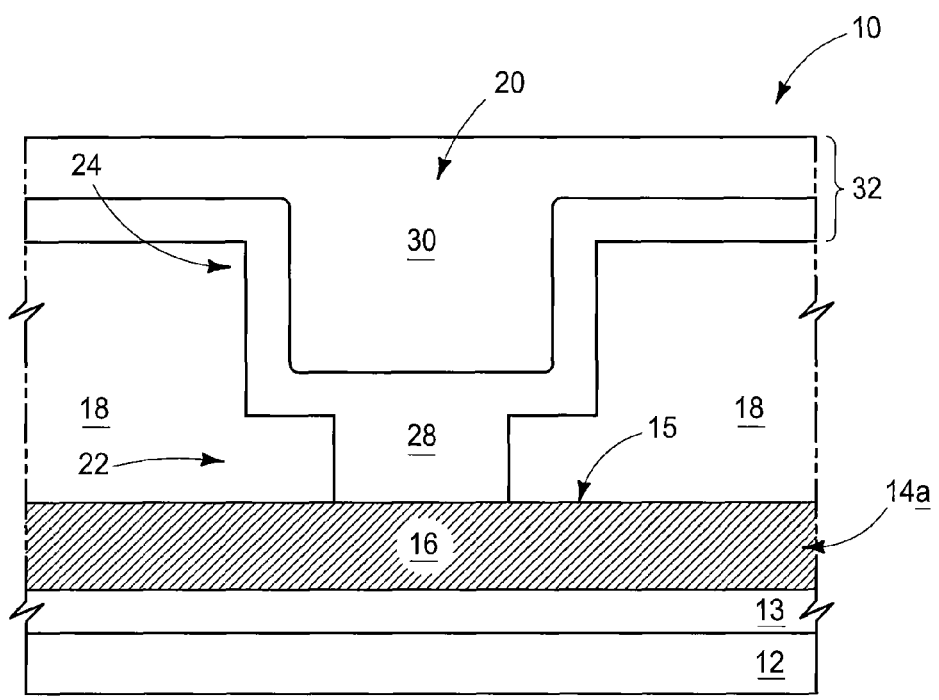

Referring to FIG. 4, a second portion 30 of the multi-portion programmable material is formed within level 24 of opening 20 to fill the opening.

The first and second portions 28 and 30 together form a multi-portion programmable material 32. Although the shown multi-portion programmable material only comprises two separate portions, in other embodiments the multi-portion programmable material may comprise more than two portions (an example of an embodiment in which the multi-portion programmable material comprises more than two portions is described below with reference to FIGS. 8-10).

The first and second portions 28 and 30 are of different compositions relative to one another, and may comprise any compositions suitable for fabrication of a multi-portion programmable material. For instance, the portions may comprise compositions suitable for utilization in one or more of PCRAM, RRAM, CBRAM, PMC, etc. In some embodiments, one or both of the portions may comprise an oxide containing one or more of aluminum, antimony, barium, calcium, cesium, germanium, hafnium, iron, lanthanum, lead, manganese, praseodymium, ruthenium, samarium, selenium, silicon, strontium, sulfur, tellurium, titanium, yttrium and zirconium. In some embodiments, one or both of the portions may comprise multivalent metal oxide; and may, for example, comprise, consist essentially of, or consist of one or more of barium, ruthenium, strontium, titanium, calcium, manganese, praseodymium, lanthanum and samarium. In some embodiments, one or both of the portions may comprise chalcogenide-type materials (for instance, materials comprising germanium in combination with one or more of antimony, tellurium, sulfur and selenium). In some embodiments, at least one of the portions comprises an ion source material suitable for contributing ions which ultimately form conductive bridges in PMC devices. The ion source material may comprise, for example, one or both of copper and silver; and may thus be configured for contributing copper cations and/or silver cations for formation of a conductive bridge. For instance, the ion source material may comprise a combination of copper and tellurium. The portions 28 and 30 may be solid, gel, or any other suitable phases.

In some example embodiments, one of the portions 28 and 30 is an ion source material (for instance, a combination of copper and tellurium) and the other is a switching region (for instance, an oxide or solid state electrolyte).

In some example embodiments, one of the portions 28 and 30 is a multivalent metal oxide and the other is a high-k dielectric. The multivalent metal oxide may comprise any suitable composition, including, for example, one or more of barium, ruthenium, strontium, titanium, calcium, manganese, praseodymium, lanthanum and samarium. In some embodiments, the multivalent metal oxide may comprise calcium manganese oxide doped with one or more of Pr, La, Sr and Sm. For instance, the multivalent metal oxide may comprise, consist essentially of, or consist of a material known as PCMO (praseodymium calcium manganese oxide). The high-k dielectric may comprise any suitable composition; and in some embodiments may comprise an oxide which includes one or more of hafnium, zirconium, yttrium, and aluminum.

Figure 5:
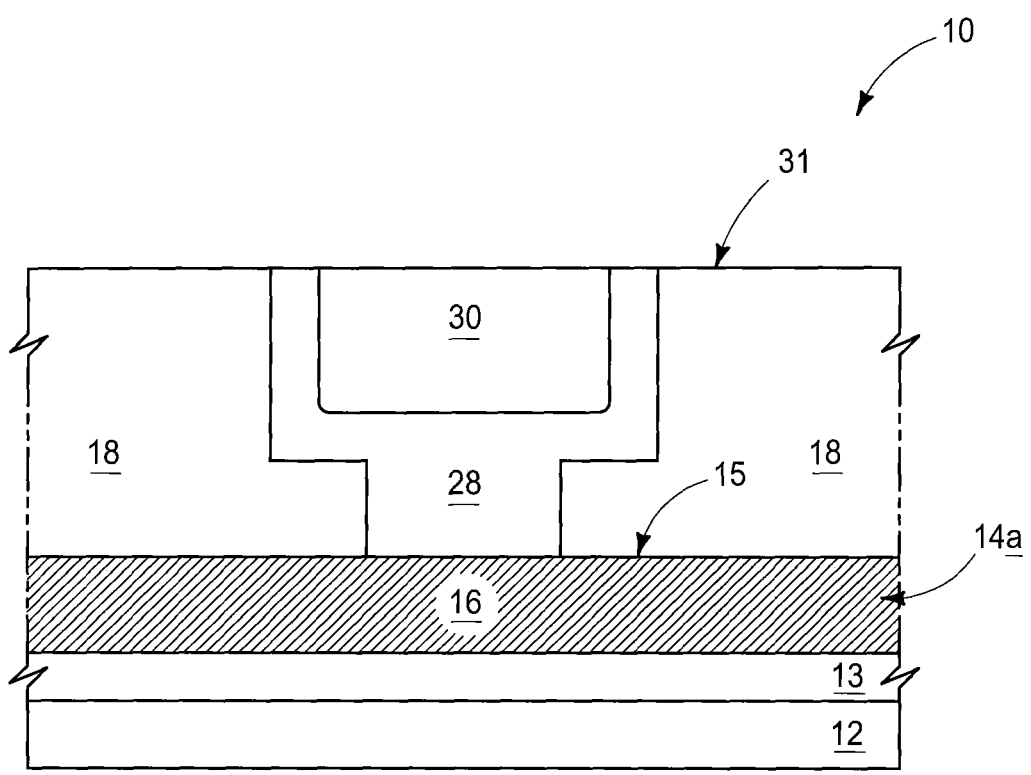
Figure 5A:
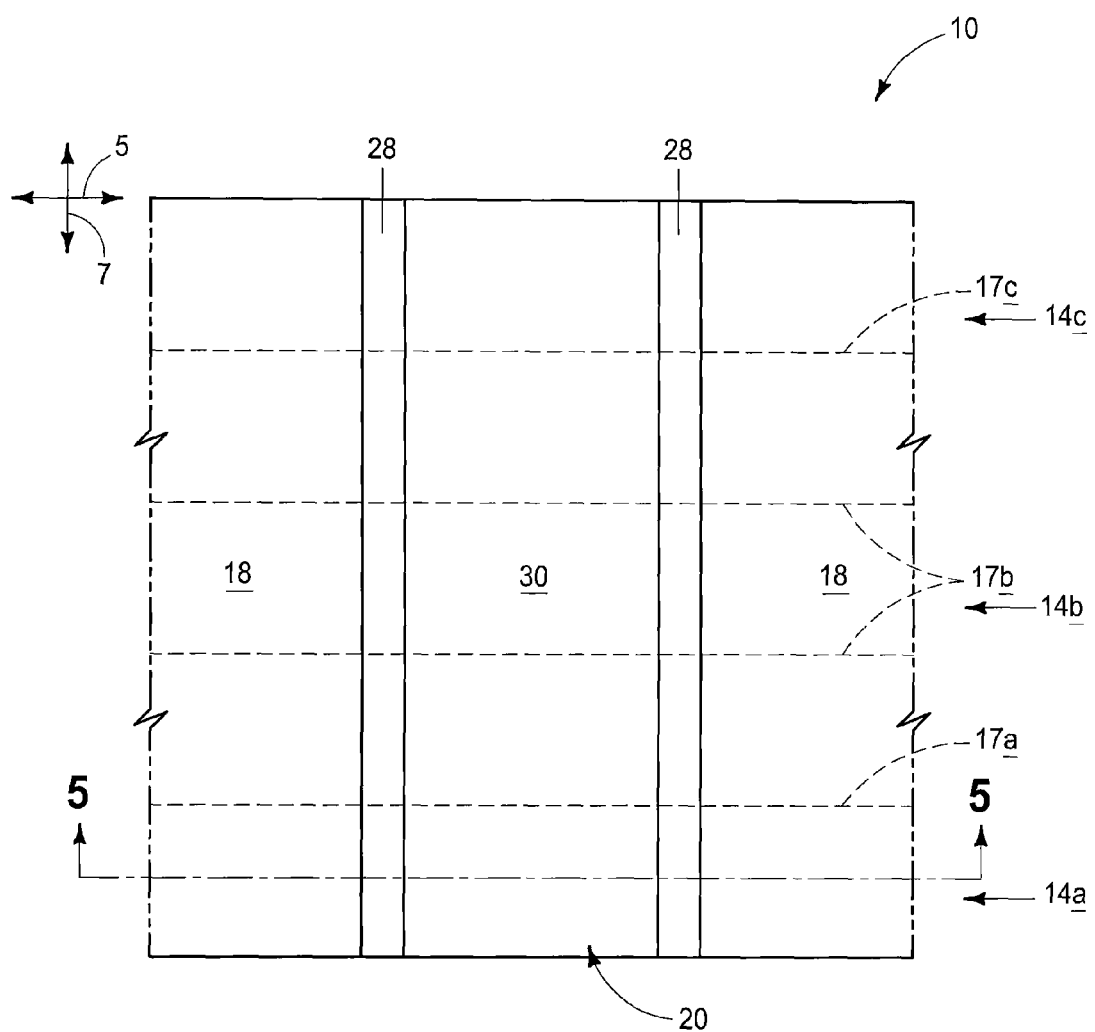

Referring to FIG. 5, construction 10 is subjected to planarization (for instance, CMP) to form a planarized surface 31 extending across material 18 and portions 28 and 30. FIG. 5A shows a top view of the construction of FIG. 5, and shows that portions 28 and 30 form structures which extend linearly along a direction orthogonal to that of conductive lines 14a-14c in the shown embodiment (with the conductive lines being evidenced in FIG. 5A by the edges 17a-17c).

Figure 6:
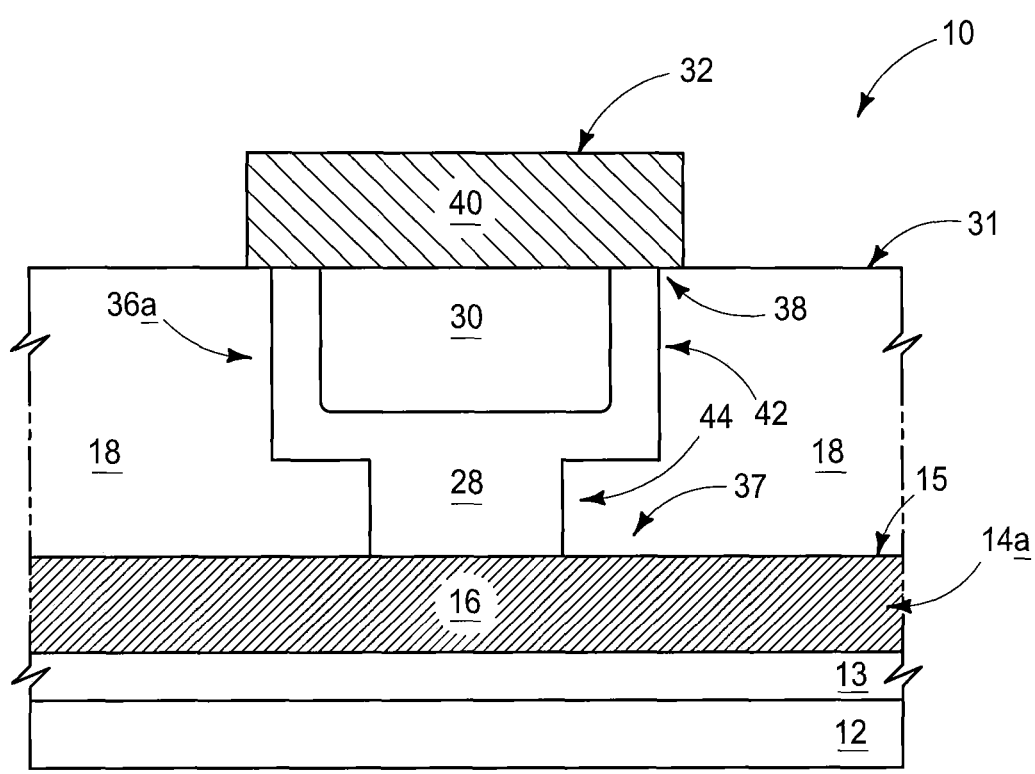
Figure 6A:
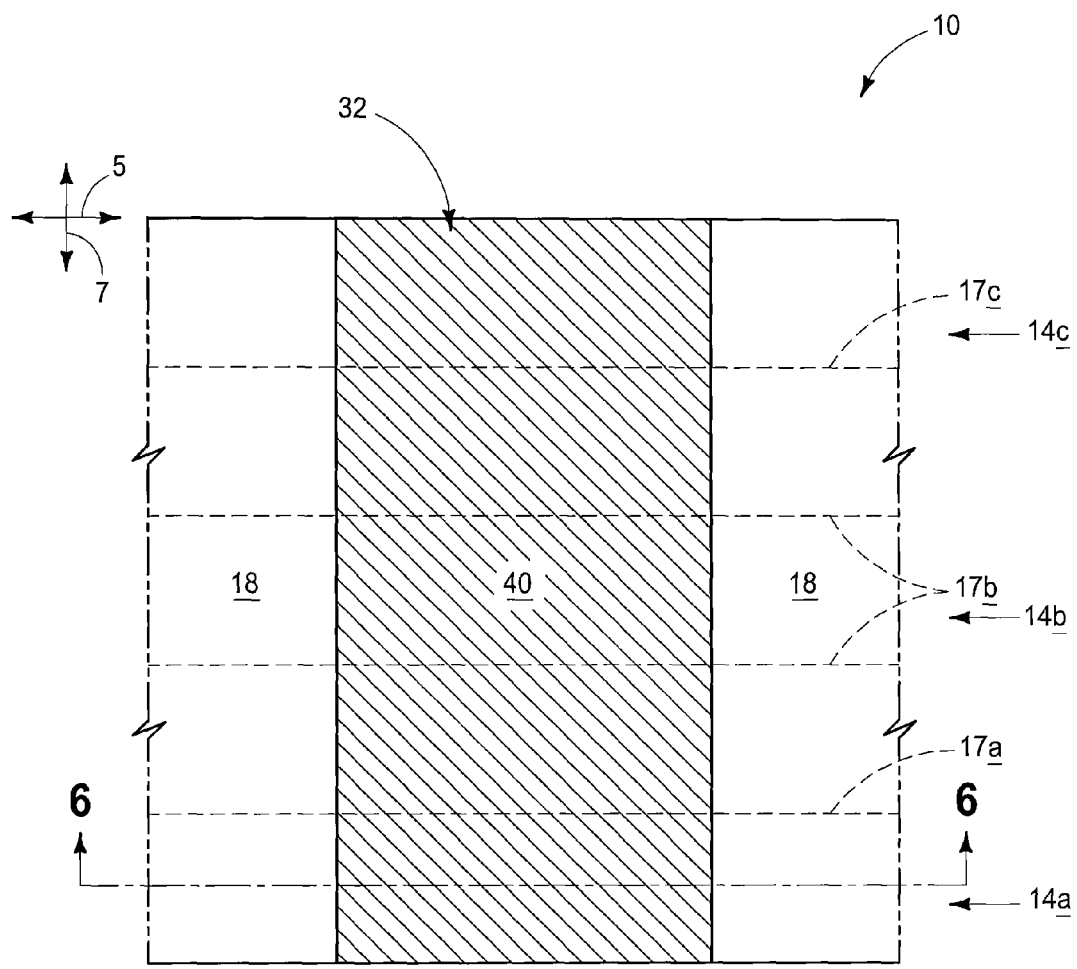
Figure 6B:
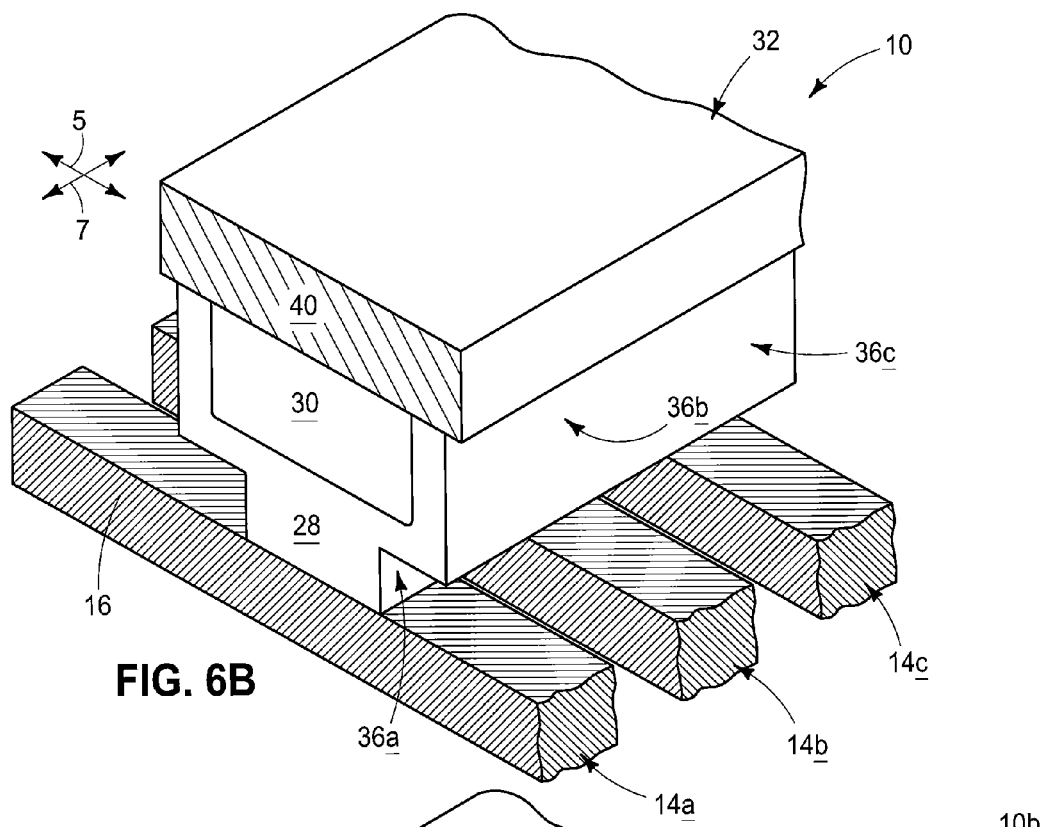
FIG. 6B is a three-dimensional view of a portion of the embodiment of FIG. 6.

Referring to FIGS. 6, 6A and 6B, construction 10 is shown at a processing stage subsequent to that of FIGS. 5 and 5A. Some parts of the construction are not shown in the three-dimensional view of FIG. 6B in order to simplify the drawing.

An electrically conductive structure 32 is formed across planarized surface 31; with the illustrated structure being a conductive line. In the shown embodiment, the conductive structure 32 has a dimension along the cross-section of FIG. 6 which is greater than the width of the multi-portion programmable material along such cross-section (i.e., the conductive structure 32 extends outwardly beyond the edges of material 28 along the cross-section of FIG. 6).

In some embodiments, the electrically conductive lines 14a-14b (FIGS. 6A and 6B) may be considered to be representative of a first series of lines that extend along the direction of axis 5, and the line 32 may be considered to be representative of a second series of lines that extend along the axis 7. Although the second series of lines are substantially orthogonal to the first series of lines in the shown embodiment, in other embodiments the first and second series of lines may extend along directions which intersect one another but which are not substantially orthogonal to one another.

Regions of the portions 28 and 30 which are directly between the conductive lines of the first and second series define memory cells at locations where the lines of the second series cross the lines of the first series. For instance, FIG. 6 shows a memory cell 36a comprising the portions of the portions 28 and 30 that are directly between the upper conductive line 32 and the lower conductive line 14a. The portion of the conductive structure 14a directly beneath the memory cell may be considered to be the bottom electrode 37 of the memory cell, and the portion of the conductive structure 32 directly above the memory cell may be considered to be an upper electrode 38 of the memory cell.

The conductive structure 32 comprises electrically conductive material 40. Such electrically conductive material may be any suitable composition or combination of compositions; including any of the compositions discussed above regarding the conductive material 16 of structure 14a. In some embodiments, the conductive material 40 may be a same composition as conductive material 16, and in other embodiments the conductive material 40 may be a different composition than conductive material 16.

In the shown embodiment, each of the conductive structures 14a and 32 comprises a single homogeneous material. In other embodiments, the bottom electrode 37 may be a region of a conductive line having one or more conductive materials different than other regions of the line to enhance adhesion to, and/or electrical coupling with, portion 28 of the programmable material. Similarly, in some embodiments the top electrode 38 may be a region of a conductive line having one or more conductive materials different than other regions of the line to enhance adhesion to, and/or electrical coupling with, the portions 28 and 30 of the programmable material. In some embodiments, one or both of the electrically conductive structures may comprise copper surrounded by copper barrier material.

The memory cell 36a of FIG. 6 may be considered to comprise a first portion 28 of the multi-portion programmable material which is configured as a container structure 42 over a pedestal 44. The pedestal 44 has a bottom width along the cross-section section of FIG. 6. The container structure 42 has a width along the cross-section which is greater than the width of the pedestal 44. The second portion 30 of the programmable material is contained within the container structure 42. The second electrode 38 is over and directly against both of the portions 28 and 30 of the multi-portion programmable material.

The three-dimensional view of FIG. 6B shows that memory cells 36a-36c are formed where the line 32 overlaps lines 14a-14c, respectively.

The portions 28 and 30 extend across multiple memory cells in the embodiment of FIG. 6B. Portions 28 and 30 may comprise suitable compositions so that crosstalk between adjacent memory cells is not problematic even though the portions 28 and 30 extend continuously across multiple memory cells. In other embodiments, it may be desired to trim the portions prior to forming line 32 so that the portions form spaced-apart programmable material segments that are in one-to-one correspondence with memory cells.

Figure 7:
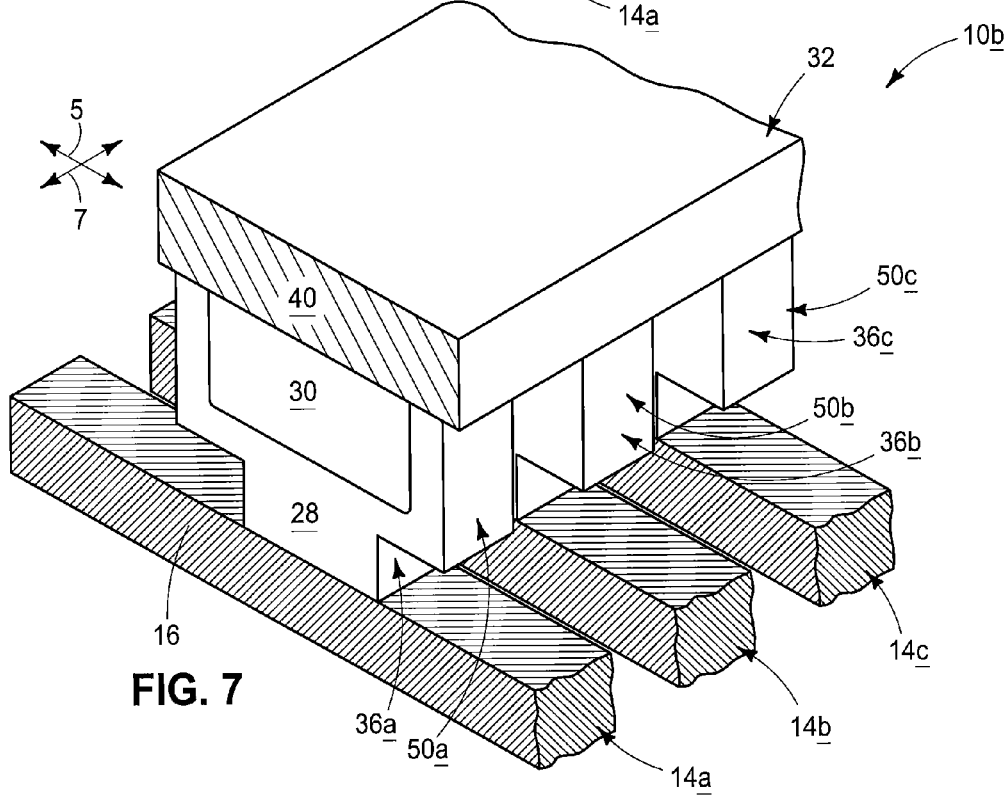
FIG. 7 is a three-dimensional view of another example embodiment.

FIG. 7 shows a construction 10b illustrating an example embodiment in which portions 28 and 30 have been sliced into spaced-apart programmable material segments 50a-50c prior to forming line 36. The slicing of portions 28 and 30 into spaced-apart structures 50a-50c may be conducted with any suitable processing; including, for example, utilizing a photoresist mask (not shown), or other suitable mask, to protect regions of the portions during removal of other regions of the portions with one or more suitable etches.

Figure 8:
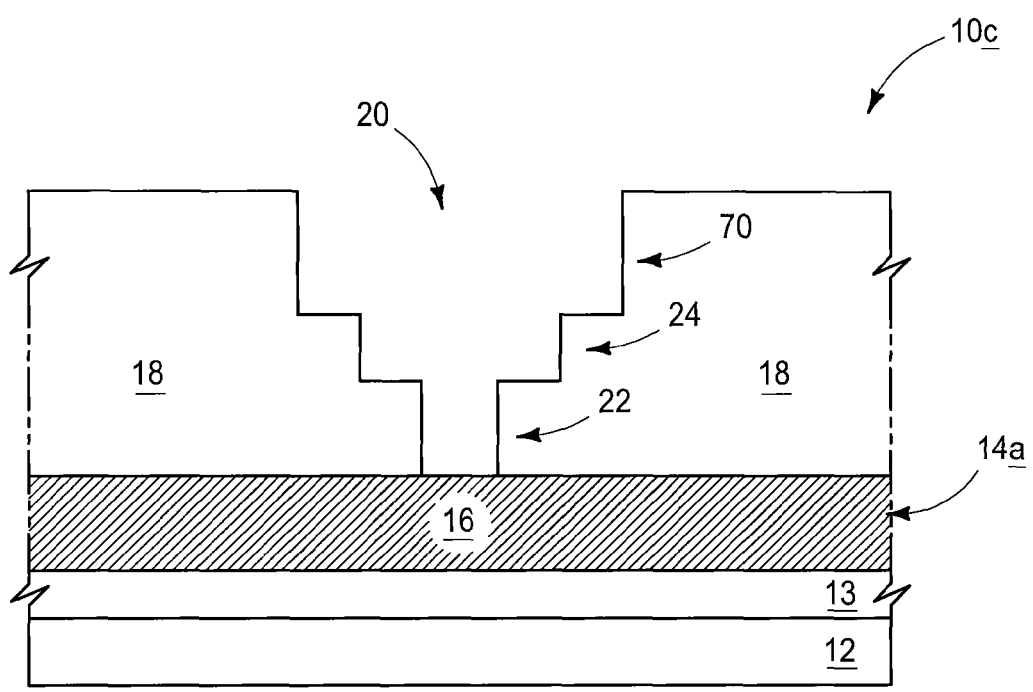
FIGS. 8-10 are diagrammatic cross-sectional views of a portion of a semiconductor construction at various process stages of another example embodiment method of forming memory cells.

The embodiments of FIGS. 1-7 describe utilization of multi-portion programmable material comprising two portions. In other embodiments, the multi-portion programmable materials may comprise more than two portions. For instance, FIGS. 8-10 describe an example embodiment for utilization of a multi-portion programmable material comprising three portions. FIG. 8 shows a construction 10c at a processing stage analogous to that described above with reference to FIG. 1. The construction of FIG. 8 is identical to that of FIG. 1 except that the opening 20 comprises an additional level 70 over the first two levels 22 and 24. The level 70 may be referred to as a third level, and is wider than the second level 24 along the cross-section section of FIG. 8.

Figure 9:
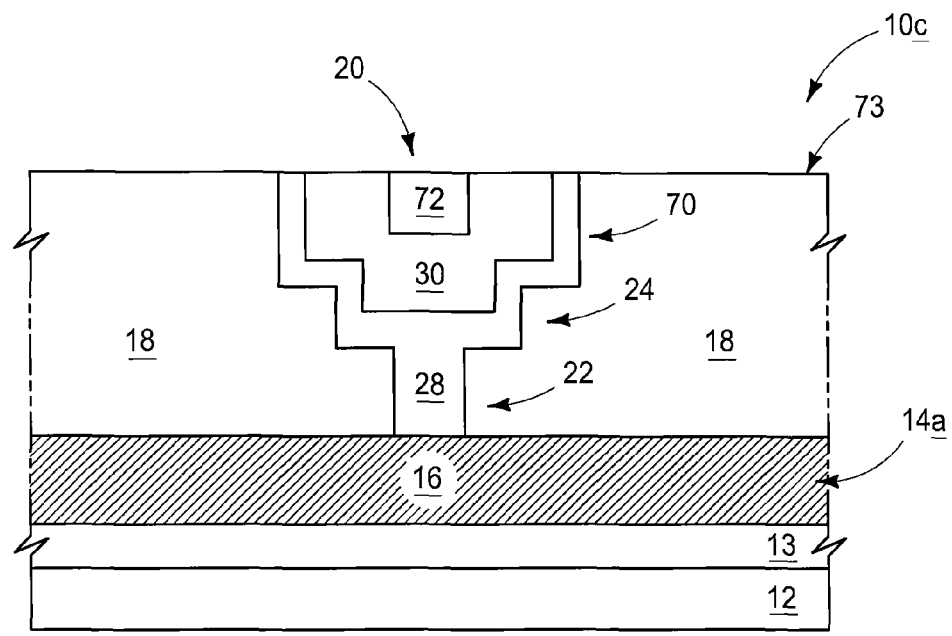

Referring to FIG. 9, the portions 28 and 30 are provided within the levels 22, 24 and 70 of opening 20. The portion 28 fills level 22, and lines levels 24 and 70; and the portion 30 fills the lined level 24, and narrows level 70 but does not fill level 70. A third portion 72 of the multi-portion programmable material is provided within the narrowed level 70 to fill the level. Subsequently, planarization is utilized to form a planarized upper surface 73 extending across material 18 and the portions 28, 30 and 72. In some embodiments, isotropic etching and/or anisotropic etching may be conducted after formation of one or both of portions 28 and 30 to form patterned sidewall liners along one or both of the levels 24 and 70. Such etching has not been conducted in the shown embodiment.

Portion 72 may comprise any suitable composition; and in some embodiments may comprise one of the compositions discussed above with reference to portions 28 and 30.

Figure 10:
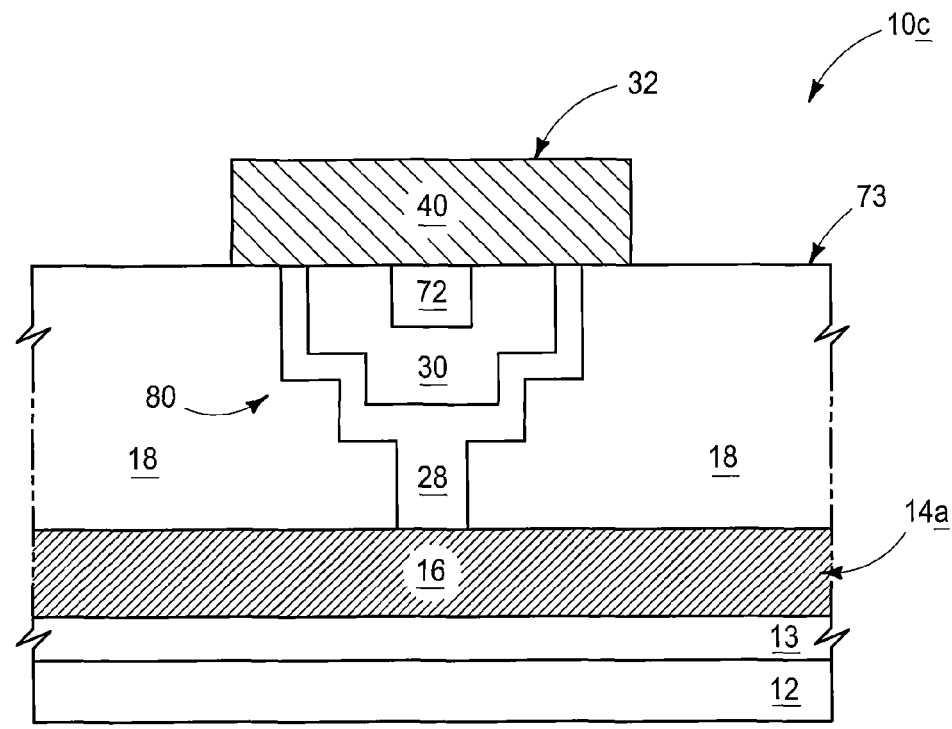

Referring to FIG. 10, the upper line 32 is formed over planarized upper surface 73. The portions 28, 30 and 72 are thus incorporated into a memory cell 80 located where the upper conductive structure 32 overlaps the lower conductive structure 14a.

The processing described above with reference to FIGS. 1-10 may provide numerous advantages relative to prior art processing utilized to form multi-portion memory cells. For instance, in some embodiments the processing of FIGS. 1-10 may be considered to comprise utilization of damascene-type processing to pattern the multiple portions of multi-portion programmable material. The damascene-type processing utilizes a combination of trenches and polishing to pattern the programmable material portions, which can be advantageous relative to prior art methods which utilize etches to pattern such portions. For instance, etches may alter characteristics of the portions adjacent etched regions, which may create difficulties in adapting conventional processes for fabrication of multi-portion programmable materials to higher levels of integration. In contrast, some embodiments of the present invention eliminate problematic prior art etching in favor of utilizing polishing to pattern the multi-portion programmable materials, which may enable utilization of the programmable materials in higher levels of integration than can be achieved with conventional processing (for instance, in some embodiments memory cells may be fabricated to at or below about 20 nanometer pitch). Additionally, some of the embodiments described herein may be suitable for lower-cost fabrication of memory arrays relative to conventional processing.

Another advantage of some embodiments described herein relative to conventional process may be that a distance between cell edges of adjacent cells is relatively large for a given pitch as compared to conventional processes, which may reduce cross-talk between adjacent memory cells.

Another advantage of some of the embodiments described herein relative to conventional processes may be that the thickness of each portion of a multi-portion programmable material can be independently controlled through either or both of deposition time and structural characteristics (for instance, step height and/or angle) of a multi-level opening.

Another advantage of some embodiments described herein relative to conventional processes may be that the various portions of multi-portion programmable material may be deposited under conditions which avoid mixing of compositional components across the portions; and such mixing may be further avoided by eliminating some of the etches of conventional processing.

Memory cells formed in accordance with some embodiments of the present invention may also have advantages relative to prior art in terms of operational characteristics of the cells. Specifically, conventional memory cells may have bottom electrodes which are narrower than the programmable material portions above such electrodes. Thus, corners of the bottom electrodes may create electrical variation relative to the planar upper surfaces of bottom electrodes which leads to variation in programming characteristics across an array of memory cells. In contrast, some embodiments of the present invention comprise memory cells having bottom electrodes which are wider than the programmable material portions above the electrodes, which may enable programming characteristics of the cells to be dictated by the planar upper surfaces of the bottom electrodes without interference from electrical variation along the upper corners of the electrodes. This may enable fabrication of memory arrays having more uniform programming characteristics across the numerous memory cells of the arrays than is achieved with conventional processing.

The memory cells and arrays discussed above may be incorporated into electronic systems. Such electronic systems may be used in, for example, memory modules, device drivers, power modules, communication modems, processor modules, and application-specific modules, and may include multi-tier, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, the invention includes a method of forming a memory cell. An opening is formed over a first conductive structure to expose an upper surface of the first conductive structure. The opening has a bottom level with a bottom width along the cross-section. The opening has a second level over the bottom level, with the second level having a second width which is greater than the bottom width. The bottom level of the opening is filled with a first portion of a multi-portion programmable material, and the second level is lined with the first portion. The lined second level is filled with a second portion of the multi-portion programmable material. A second conductive structure is formed over the second portion.

In some embodiments, the invention includes a method of forming a plurality of memory cells. A first trench is formed over a series of first electrically conductive lines. The first trench extends primarily along a first direction and has a first width along a second direction substantially orthogonal to the first direction. The first electrically conductive lines extend primarily along the second direction. A second trench is formed over the first trench. The second trench is wider than the first trench along the second direction. A first portion of a multi-portion programmable material is formed within the first and second trenches. The first portion fills the first trench and lines sidewalls of the second trench. The lined second trench is filled with a second portion of the multi-portion programmable material. A second electrically conductive line is formed over the second portion. The second electrically conductive line extends primarily along the first direction. Individual memory cells comprise regions of the programmable material directly between the first and second electrically conductive lines.

In some embodiments, the invention includes a memory cell. A first conductive structure has an upper surface. A first portion of a multi-portion programmable material is over the first conductive structure and directly against the upper surface of the first conductive structure. The first portion is configured as a container structure over a pedestal. The pedestal has a bottom width along the cross-section. The container structure has a second width which greater than the bottom width. A second portion of the multi-portion programmable material is within the container structure. A second conductive structure is over the second portion.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell, comprising:
a first conductive structure having an upper surface;
an opening within a single electrically insulative material and over the first conductive structure, the opening having a lower area and a wider upper area having sidewalls consisting of the single electrically insulative material;
a first portion of a multi-portion programmable material over the first conductive structure directly against the upper surface of the first conductive structure and within the opening, the first portion filling the lower area of the opening and lining the sidewalls in direct physical contact with the single electrically insulative material, the first portion being configured as a container structure over a pedestal, the pedestal having a bottom width along a cross-section, the container structure having a second width which is greater than the bottom width;
a second portion of the multi-portion programmable material within the container structure;
a second conductive structure over the second portion; and
wherein one of the first and second portions comprises an ion source region and the other of the first and second portions comprises a switching region.

2. The memory cell of claim 1 wherein:
the cross-section is along a first direction;
the first conductive structure is one of a plurality of first conductive structures spaced-apart from one another along a second direction substantially orthogonal to the first direction;
the container structure extends across a plurality of the first conductive structures.

3. The memory cell of claim 1 wherein:
the cross-section is along a first direction;
the first conductive structure is one of a plurality of first conductive structures spaced-apart from one another along a second direction substantially orthogonal to the first direction; and
the container structure is directly over only the first conductive structure.

4. The memory cell of claim 1 wherein:
the cross-section is along a first direction;
an upper surface of the container structure has a width along the first direction; and
the second conductive structure has a dimension along the first direction which is greater than or equal to the width of the container structure upper surface.

5. The memory cell of claim 1 wherein:
the container structure is a first container structure;
the first portion is configured to comprise a second container structure over the first container structure, the second container structure being wider along the cross-section than the first container structure;
the second portion fills the first container structure and lines the second container structure;
a third portion of the multi-portion programmable material is within the lined second container structure; and
the second conductive structure is formed over the third portion.

6. A memory cell, comprising:
a first conductive structure having an upper surface within an opening in a single electrically insulative material, the opening having sidewalls consisting of the single electrically insulative material;
a first portion of a multi-portion programmable material over the first conductive structure and directly against the upper surface of the first conductive structure, the first portion lining an entirety of the sidewalls of the opening, the first portion being configured as a container structure over a pedestal, the pedestal having a bottom width along a cross-section, the container structure having a second width which is greater than the bottom width;
a second portion of the multi-portion programmable material within the container structure;
a second conductive structure over the second portion; and
wherein one of the first and second portions comprises high-k dielectric material and the other of the first and second portions comprises multivalent metal oxide.

* * * * *